United States Patent [19]

Pearson et al.

[11] Patent Number: 4,701,379
[45] Date of Patent: Oct. 20, 1987

[54] BORON HYDRIDE POLYMER COATED SUBSTRATES

[75] Inventors: Richard K. Pearson, Pleasanton; Roman I. Bystroff; Dale E. Miller, both of Livermore, all of Calif.

[73] Assignee: The United States of America as represented by the United States Department of Energy, Washington, D.C.

[21] Appl. No.: 900,859

[22] Filed: Aug. 27, 1986

[51] Int. Cl.$^4$ .............................................. B05D 3/06
[52] U.S. Cl. .................................. 428/427; 376/151; 376/916; 427/6; 427/39; 428/704
[58] Field of Search ................ 427/38, 39, 41, 6; 315/111.41, 111.71; 376/151, 916; 428/427, 704

[56] References Cited

U.S. PATENT DOCUMENTS

| | | | |
|---|---|---|---|
| 3,565,683 | 2/1971 | Morelock | 428/427 |
| 4,029,045 | 6/1977 | Cielaszyk et al. | 427/251 |
| 4,091,166 | 5/1978 | Kubacki | 428/704 |
| 4,266,506 | 5/1981 | Miller | 427/6 |
| 4,323,420 | 4/1982 | Masnari et al. | 156/633 |

OTHER PUBLICATIONS

Letts et al., "J. Vac. Sci. Technol", vol. 19, No. 3, Sep.-/Oct. 1981, pp. 739-742.

*Primary Examiner*—John H. Newsome
*Attorney, Agent, or Firm*—Shyamala T. Rajender; L. E. Carnahan; Judson R. Hightower

[57] ABSTRACT

A method is disclosed for coating a substrate with a uniformly smooth layer of a boron hydride polymer. The method comprises providing a reaction chamber which contains the substrate and the boron hydride plasma. A boron hydride feed stock is introduced into the chamber simultaneously with the generation of a plasma discharge within the chamber. A boron hydride plasma of ions, electrons and free radicals which is generated by the plasma discharge interacts to form a uniformly smooth boron hydride polymer which is deposited on the substrate.

17 Claims, 2 Drawing Figures

BORON HYDRIDE POLYMER COATED SUBSTRATES

The U.S. Government has rights in this invention pursuant to Contract No. W-7405-ENG-48 between the U.S. Department of Energy and the University of California, for the operation of the Lawerence Livermore National Laboratory.

FIELD OF THE INVENTION

This invention relates generally to substrates coated with boron hydride polymer, and more particularly to those polymer coatings possessing a smooth, transparent surface with a defect of no higher than about 0.1 micrometer and to applications thereof.

BACKGROUND OF THE INVENTION

Plasma polymerization has been widely employed for coating various types of targets, primarily due to the uniformity of deposits on the target. To meet design standards for ablatively driven targets capable of imploding gases to high densities, the coating thickness must be uniform within 2 percent of the wall thickness, void free, and smooth with few defects.

Plasma polymerization of various gaseous groups utilizes a gas discharge to dissociate gas molecules into ions and free radicals. The molecular fragments later recombine to form a brittle polymer coating. Previous investigators have employed inductively coupled discharge devices operating at about 36 MHz to form either fluorocarbon or hydrocarbon coatings.

Boron hydride polymers have lower molecular weights than hydrocarbon polymers and hence should show significantly better ablation performance. Attempts to produce boron hydride polymers have been reported previously. These methods failed to produce a smooth surface polymer which is desirable for various applications. Such methods include the thermopyrolysis of volatile borons, electric discharge, photolysis with ultraviolet light, electrolysis discharge, $CO_2$ laser arc ablation of $B_2H_6$ sensitized with $SF_6$, and shock tube adiabatic compression.

Although hydrocarbons have been employed as coatings for substrates including microballoons, boron hydride polymers have a higher ablation pressure and hence are more desirable. Accordingly, it would be an advancement to provide boron hydride polymers which possess smooth surface areas (no defect on the surface higher than about 0.1 micrometer) which can be coated on a suitable substrate such as a target microballoon.

SUMMARY OF THE INVENTION

Accordingly, an object of the present invention is to provide smooth boron hydride polymer coatings.

Another object of the invention is to provide a method for coating a substrate with a smooth boron hydride polymer.

Another object of the invention is to provide a microballoon target which is coated with a smooth boron hydride polymer.

Additional objects, advantages and novel features of the invention will be set forth in part in the description which follows, and in part will become apparent to those skilled in the art upon examination of the following or may be learned by practice of the invention. The objects and advantages of the invention may be realized and obtained by means of the instrumentalities and combinations particularly pointed out in the appended claims.

To achieve the foregoing and other objects in accordance with the purpose of the present invention, as embodied and broadly described herein, the subject invention provides a method for coating a substrate or substrates with a smooth layer of boron hydride polymer and an apparatus for generating a boron hydride plasma. The method, broadly comprises, introducing at least one solid substrate and a gas consisting essentially of boron hydride into a closed container or chamber and applying an electric field to the chamber or container to produce a gas plasma within the chamber. The boron hydride polymer produced thereby is deposited on the solid substrate. Suitable solid substrates include glass and the like, hollow glass or polymer spheres being most suitable for most applications. More specifically, the method comprises providing an apparatus with a sealable chamber for generating a boron hydride plasma. The chamber may be equipped with appropriate inlets and outlets for introducing various reactants or carriers or for generating a vacuum and the like. A suitable substrate (or substrates) is disposed within the chamber which is then evacuated. A boron hydride feedstock is introduced into the chamber. A plasma discharge is generated within the chamber simultaneously with the introduction of the hydride feedstock into the chamber and the discharge in the chamber is continued to form a boron hydride plasma of ions, electrons and free radicals which interact to form on the substrate a layer of boron hydride polymer with a uniformly smooth surface.

One aspect of the instant invention provides a substrate coated with an ultra smooth layer of boron hydride with surface defects of no more than about 0.1 micrometer. The apparatus for the preparation of the boron hydride plasma comprises wall members defining a closed plasma chamber, inlet and outlet means operatively connected to the chamber, and means for generating a plasma discharge within the chamber. A suitable substrate (or substrates) is disposed within the chamber, the chamber is sealed off and evacuated to a pressure of about $10^{-6}$ torr. A boron hydride feedstock is introduced into the chamber at a flow rate of about of 0.1 SCCM to about 1.0 SCCM and is allowed to continue to flow into the chamber until an internal pressure of about 0.01 to 2.0 torr is attained within the chamber. Simultaneously with the introduction of the feedstock into the chamber, a plasma discharge is generated within the chamber, with the discharge continuing to form a boron hydride plasma of ions and free radicals is formed. The plasma so formed, interacts with itself to form a boron hydride polymer of the formula $(BH)_x$ which is deposited on the substrate as a uniformly smooth layer. The deposition occurs evenly around the substrate, and the polymer surface has no defect higher than about 0.1 micrometer.

Another aspect of the present invention relates to an article of manufacture comprising a substrate coated with a smooth boron hydride polymer surface. In one embodiment of the invention, the substrate is a glass or polymer microballoon fusion target with a boron hydride polymer coating about 10 micrometers thick.

The boron hydride polymer coated substrates of the present invention are attractive alternatives to hydrocarbon polymer ablated materials. Not only do they provide transparency in the visible region of the spectra, enabling diagnostics of cryogenic fuel placement within a substrate such as a microshell, and an increased efficiency for the ablator. Polymer coatings produced for such applications are required to be ultrasmooth with submicrometer defects as provided by the subject invention.

BRIEF DESCRIPTION OF THE DRAWINGS

The accompanying drawings, which are incorporated in and form a part of the specification, illustrate different embodiments of the invention, and, together with the description, serve to explain the principles of the invention.

DETAILED DESCRIPTION OF THE INVENTION

Figure 1:
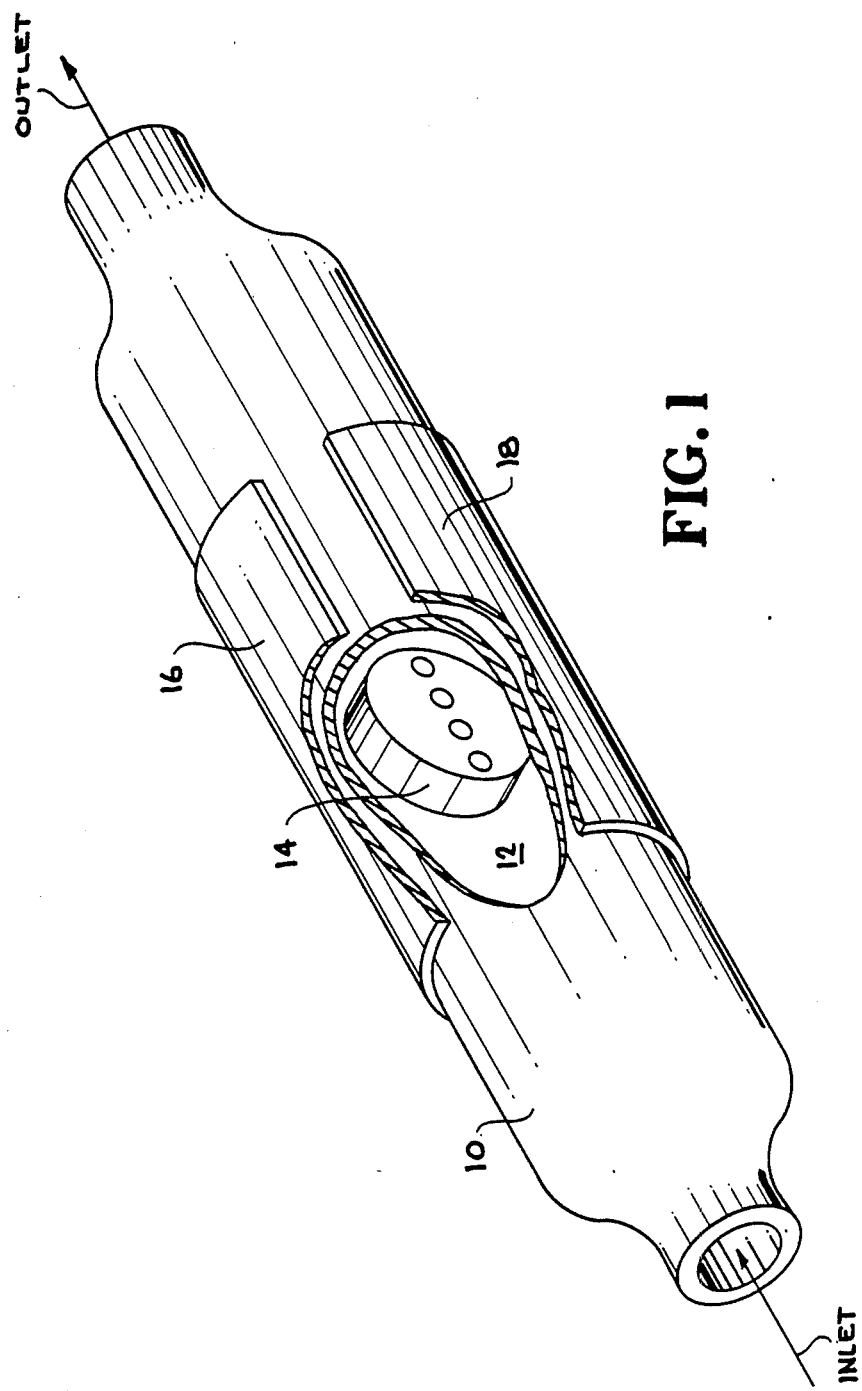
FIG. 1 illustrates perspectively an RF discharge apparatus for polymerizing a boron hydride feedstock and for coating a substrate with the polymer.
Figure 2:
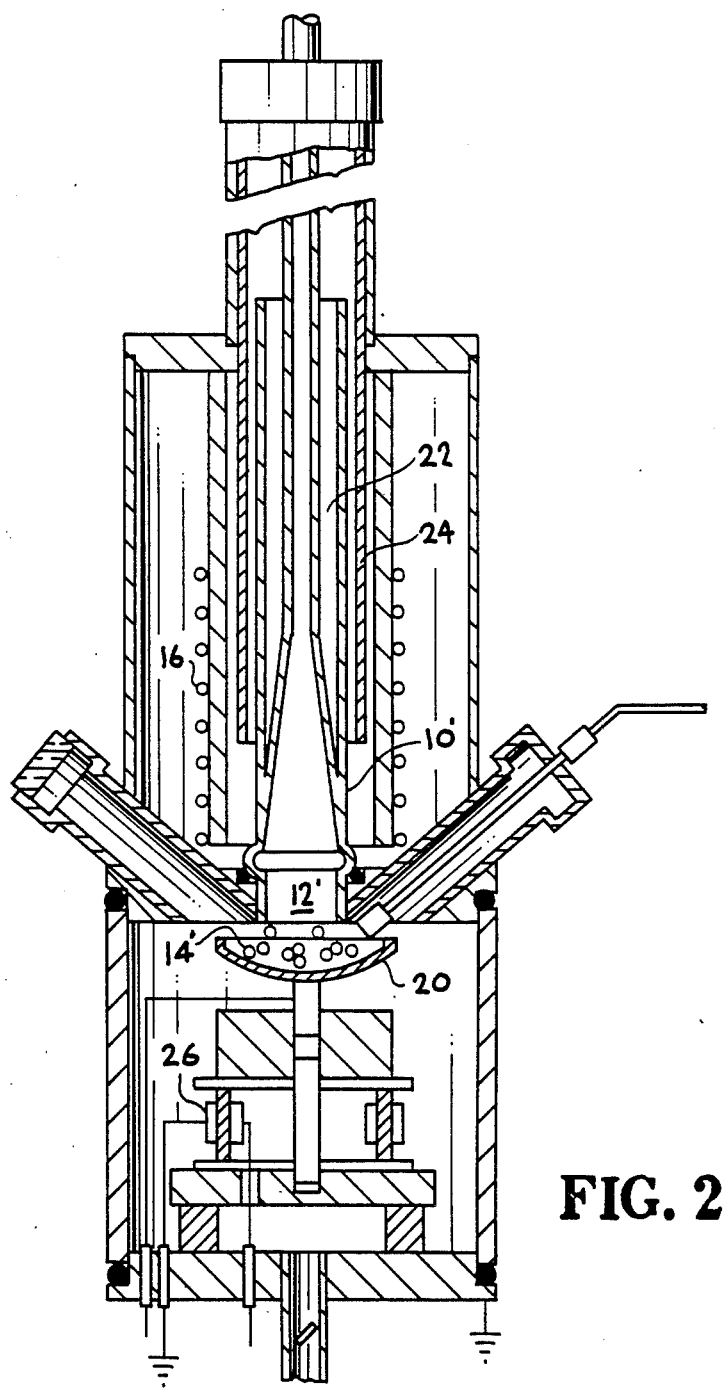
FIG. 2 illustrates a cross-sectional view of a second embodiment of an apparatus for producing a boron hydride polymer through RF discharge.

The present invention provides a method for coating a substrate with a uniformly smooth layer of a boron hydride polymer. The method comprises providing an apparatus equipped with a sealable chamber for generating a boron hydride plasma, disposing a suitable substrate within the sealable chamber, and generating within the sealable chamber, an electric discharge. The apparatus comprises wall members defining the sealable plasma chamber, inlet and outlet means operatively connected to the chamber, and means for generating an electron discharge within the chamber. A suitable substrate is disposed within the chamber and the chamber is then evacuated through the outlet means until a pressure of less than about $10^{-6}$ torr is reached. A boron hydride feedstock is introduced through the inlet means into the chamber at a rate of about 0.1 SCCM to about 1.0 SCCM and continues to flow into the chamber until a pressure of about 0.01 to 2.0 torr is maintained. Simultaneously with the introduction of the boron hydride feedstock flow, a plasma discharge is generated within the chamber. A boron hydride plasma of ions, free radicals and electrons is created which interact to form a uniformly smooth boron hydride polymer which is deposited on the substrate. Because the amount of deposited polymer is dependent on the length of time the boron hydride feedstock is polymerized within the chamber, the electron discharge is continued for as long as the desired thickness of the polymer deposit on the substrate is achieved.

In a further aspect of the present invention, an article of manufacture is provided which comprises a substrate coated with a uniformly smooth layer of a boron hydride polymer.

As used herein, smoothness of the polymer surface is defined as a variation of not more than about 0.5 micrometer between the hills and valleys of the surface.

Smoothness of the polymer surface is dependent on the rate of flow and composition of the hydride feedstock into the plasma chamber. Preferably, a flow rate of about 0.1 to 5 SCCM is preferred. The hydride feedstock can comprise either the boron hydride by itself or may also include a diluent or carrier gas to aid the discharge. Suitable diluents or carrier gases include but are not limited to any of the inert gases such as argon and helium, or hydrogen. The absence of oxygen and/or moisture is desirable, in order to avoid degradation of the polymer or reaction of the initial boron hydride.

Of particular significance is the even generation of the electron discharge within the chamber which in turn will form an uniformly smooth plasma and thus provide a uniform coating of polymer on the substrate. One of the parameters of this even distribution is the geometry.

Suitable boron hydrides include $B_2H_6$, $B_4H_{10}$, $B_5H_9$, $B_{10}H_{14}$, and "ortho-, meta- and paracarboranes" or $(B_{10}C_2H_{12})$.

The method of the present invention can be practiced by use of an electrodeless discharge method, wherein electrodes are placed on the outside of a glass container used as a plasma chamber. In this embodiment, the excitation for the discharge is provided by a 13 kV, 60 Hz AC transformer. In a variant embodiment, an RF discharge apparatus may be employed.

With reference now to FIG. 1, one embodiment of an apparatus for coating a substrate with a smooth boron hydride polymer includes quartz wall means 10 which define a plasma chamber 12. Inlet and outlet means operatively connect chamber 12 with a source of hydride feedstock (not shown), a carrier gas (not shown), and a vacuum system (not shown), respectively. A substrate 14 is disposed within the chamber. Suitable substrates include any item which can be coated by the polymer but preferably are solid surfaces and more preferably, consist essentially of glass. Most preferably, the substrate is a hollow glass or polymer sphere or microballoon fusion target. Suitable polymer for microballoons include but are not limited to polystyrene, polyvinylalcohol and the like. The microballoon may be fabricated to have a diameter of about 0.1 to about 1 mm. Two half cylindrical external metal electrodes 16 and 18, respectively, are connected to a power supply (not shown) and utilized to generate the electron discharge within chamber 12.

Power and flow conditions of the hydride with or without a carrier gas are optimized to yield the smooth uniform polymer coating on the substrate. Preferably, substrate 14 is positioned centrally within chamber 12 as to provide an even deposition of the polymer. Preferred conditions for obtaining a smooth coating with the apparatus illustrated in FIG. 1 are about 2 to 6 watts power, a hydride flow rate of about 0.1 to 2.0 standard cc per minute (SCCM), preferably, about 1.0 SCCM, a diluent or carrier flow (if one is employed) of about 1 to 15 SCCM, and the optimum pressure within chamber 12 is about 0.06 to 6.0 torr.

In a further aspect of the method of the invention, the coated substrate may be further coated with a protective layer of a hydrocarbon polymer to reduce the rate of attack of moisture on the boron hydride. This is achieved by introducing trans-2-butene gas, after evacuation of chamber 12, at a flow rate of about 0.2 to 10 watts for about 20 minutes or more.

Referring now to the second embodiment of the apparatus for coating substrates with boron hydride polymers, quartz walls 10' define a plasma chamber 12' where microballoon fusion targets 14' are disposed within chamber 12' and supported on a bouncer pan 20. An RF coil 16 is disposed in surrounding relationship to chamber 12' and separated therefrom by a water jacket 22, and an RF shield 24. Means are employed for moving bouncer pan 20 so as to provide a bouncing motion imparted to microballoons 14' so as to ensure an even distribution of the boron hydride polymer coating on the microballoons. Such means include but are not limited to a piezoelectrically driven motorized apparatus 26.

The following examples are meant to illustrate various embodiments of the present invention, and are not deemed to limit the invention which is defined in the appended claims.

EXAMPLE 1

Diborane Feedstock:

An initial experiment using diborane at 60 Torr and electrodeless discharge (electrodes outside of the glass plasma chamber) produced a transparent yellow solid which coated a glass slide and the inner walls of the reactor. Examination of the surface of the $(BH)_x$ solid by SEM showed its smoothness to be comparable to $(CH_{1.3})_x$ coatings and its thickness to be about 12 micrometers. The power supply for the electrodeless discharge was a 12 kV, 60 Hz AC transformer. Diborane was charged into the closed reactor at 70 Torr and the pressure increase was monitored by an electronic manometer. Initially, for about 1 to 2 hours, there was a slight pressure increase of less than 2 Torr. The pressure then rose rapidly for about half an hour to 90 Torr where it remained constant. The discharge was then stopped, and excess $B_2H_6$ and $H_2$ along with $B_5H_9$ were removed from the reactor and analyzed. The overall reaction with intermediate species not shown was:

$$B_2H_6 \rightarrow B_5H_9 + (BH)_x + H_2$$

EXAMPLE 2

Decaborane Feedstock:

Decaborane $B_{10}H_{14}$ at 0.3 Torr was passed, along with argon, through a plasma chamber with metal electrodes 1.0 cm apart using 60 Hz discharge conditions 60 V and 0.6 A. Argon was employed as a diluent to stabilize the discharge. The $(BH)_x$ polymer from $B_{10}H_{14}$ was coated from a KBr disk located between and perpendicular to, the nickel electrodes. An infrared spectrum of the deposited polymer showed strong BH stretch absorption at 2570 cm$^{-1}$ and other structural features that differ from the $(BH)_x$ polymer product obtained by $B_2H_6$ pyrolysis. This was the first $(BH)_x$ polymer prepared from $B_{10}H_{14}$ alone. The $(BH)_x$ deposit was a milky yellow, and microscopic examination revealed tiny white crystals of a crystalline compound embedded in the surface of the polymer.

EXAMPLES 3 and 4

Diborane Feedstock:

A feedstock of diborane with argon was discharged into a quartz plasma chamber and polymerization achieved with an RF discharge. A smooth layer of boron hydride polymer was deposited on a 13×2 mm KBr infrared circular window. The condition for the polymerization and deposition are listed in Table I.

TABLE I

| Diborane-Argon Experiment | |
|---|---|
| Experiment 14 | Experiment 15 |
| $B_2H_6$ Flow Rate | |
| 1.36 SCCM | 0.68 SCCM |
| Coating Time | |
| 79 minutes | 79 minutes |
| Ar Flow Rate | |
| 2.0 SCCM | 2.0 SCCM |
| Total Pressure | |
| 2.0 torr | 3.0 torr |//
| Power | |
| 2.4-3 watts | 6 watts |

TABLE I-continued

| Diborane-Argon Experiment | |
|---|---|
| Experiment 14 | Experiment 15 |
| Power | |
| 2.4-3 watts | 6 watts |

In each case, after discharge ceased, trans-2-butene (without argon) was introduced into the discharge chamber at 0.2 SCCM flow rate for about 20 minutes. The IR spectra showed a protective coating of hydrocarbon polymer having a thickness of about 0.4 microns. The boron hydride polymer had a thickness of about 12 micrometers.

The subject invention thus provides a method and apparatus for coating solid substrates with a uniform layer of a boron hydride polymer. The method is particularly suitable for coating glass or polymer microballoons for use as fusion targets.

The above embodiments were chosen and described in order to explain best the principles and the practical application of the subject invention thereby to enable those skilled in the art to utilize the invention in various other embodiments and various modifications as are suitable for the particular use contemplated. The foregoing description of a preferred embodiment of the invention has been presented therefore for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of coating a substrate with a uniformly smooth layer of boron hydride polymer, comprising:
   (a) providing an apparatus for generating a boron hydride plasma, said apparatus comprising wall means defining a sealable plasma chamber, inlet and outlet means operatively connected to said chamber, and means for generating a plasma discharge within said chamber;
   (b) disposing a substrate within said chamber;
   (c) evacuating said chamber through said outlet means;
   (d) introducing a boron hydride feedstock into said chamber through said inlet means; and
   (e) generating a plasma discharge within said chamber simultaneously with the introduction of said hydride feedstock into said chamber and continuing said discharge therein to form a boron hydride plasma of ions, electrons and free radicals which interact to form on said substrate a layer of boron hydride polymer with a uniformly smooth surface.

2. The method of claim 1, wherein said feedstock is introduced into said chamber at a rate of about 0.1 SCCM to about 1.0 SCCM and continuing said flow until a pressure of about 0.01 to 2.00 torr is reached in said chamber.

3. The method of claim 1, additionally comprising introducing a diluent or carrier simultaneously with the introduction of said boron hydride feedstock.

4. The method of claim 3, wherein said diluent or carrier is selected from the inert gases and hydrogen gas.

5. The method of claim 1, further comprising a hydrocarbon polymer coating over said layer of boron hydride polymer on said substrate.

6. The method of claim 5, wherein said substrate is comprised of glass.

7. The method of claim 6, wherein said substrate is a glass or polymer microballoon fusion target.

8. The method of claim 7, wherein said boron hydride is selected from the group consisting of $B_2H_6$, $B_4H_{10}$, $B_5H_9$, $B_{10}H_{14}$, and $B_{10}C_2H_{12}$.

9. A method of coating a solid substrate with boron hydride polymer comprising:
   (a) introducing at least one solid substrate and boron hydride into a closed container; and
   (b) applying an electric field to said container.

10. The method of claim 9, wherein said boron hydride is selected from the group consisting of $B_2H_6$, $B_4H_{10}$, $B_5H_9$, $B_{10}H_{14}$, and $B_{10}C_2H_{12}$.

11. The method of claim 10, wherein said substrate is comprised of glass.

12. The method of claim 11, wherein said substrate is a glass or polymer microballoon fusion target.

13. An article of manufacture, comprising a glass or polymer microballoon fusion target coated with a layer of boron hydride polymer.

14. The article of claim 13, wherein said microballoon has a diameter of about 0.1 to 1 mm.

15. The method of claim 14, wherein said boron hydride is selected from the group consisting of $B_2H_6$, $B_4H_{10}$, $B_5H_9$, $B_{10}H_{14}$, and $B_{10}C_2H_{12}$.

16. The article of claim 15, wherein said boron hydride polymer has a thickness of about 10 micrometers.

17. The article of manufacture of claim 16, further comprising a layer of hydrocarbon polymer disposed on an exterior surface of said boron hydride polymer.

* * * * *